United States Patent [19]

Bruning et al.

[11] 4,171,870

[45] Oct. 23, 1979

[54] COMPACT IMAGE PROJECTION APPARATUS

[75] Inventors: John H. Bruning, Brookside; Alan D. White, Berkeley Heights, both of N.J.

[73] Assignee: Bell Telephone Laboratories, Incorporated, Murray Hill, N.J.

[21] Appl. No.: 794,338

[22] Filed: May 6, 1977

[51] Int. Cl.² ............................................. G02B 17/08
[52] U.S. Cl. .................................... 350/173; 350/199
[58] Field of Search ............................. 350/173, 199

[56] References Cited

U.S. PATENT DOCUMENTS

| | | | |
|---|---|---|---|
| 2,231,378 | 2/1941 | Becker et al. | 355/66 |
| 2,556,871 | 6/1951 | Degnan et al. | |
| 3,054,326 | 9/1962 | Giesecke | 350/203 |
| 3,536,380 | 10/1970 | Ferguson | 350/199 |
| 3,819,265 | 6/1974 | Feldman et al. | 355/51 |
| 3,990,771 | 11/1976 | Hundelshausen et al. | 350/173 |
| 4,103,989 | 8/1978 | Rosin | 350/199 |

FOREIGN PATENT DOCUMENTS 553569  5/1977  U.S.S.R. ................................... 350/199

OTHER PUBLICATIONS

Wynne, C. G. "A Unit-Power Telescope for Projection Copying", *Optical Instruments and Techniques* 1969, edited by J. H. Dickson, Oriel Press, England, 1970, pp. 429-434.
Dyson, J. "Unit Magnification Optical System Without Seidel Aberrations", *Journal of the Optical Society of America* vol. 49, No. 7, Jul. 1959, pp. 713-716.

*Primary Examiner*—John K. Corbin
*Assistant Examiner*—R. A. Rosenberger
*Attorney, Agent, or Firm*—Maurice dePicciotto; Lucian C. Canepa

[57] ABSTRACT

A compact image projection apparatus comprises a concave spherical mirror, a plano-convex lens, a quarter wave plate and two prisms one of which is a roof prism. The apparatus is such that object and image have the same orientation and are positioned in two parallel planes. The apparatus is located, for example, between a mask and a semiconductor wafer in a scanning projection printing system.

7 Claims, 2 Drawing Figures

COMPACT IMAGE PROJECTION APPARATUS

The present invention relates to optical systems, and more particularly, to a compact image projection apparatus used in semiconductor fabrication.

BACKGROUND OF THE INVENTION

Contact printing and projection printing are known masking techniques used in the fabrication of semiconductor devices. Projection printing offers the advantage of avoiding contact between the mask and a photoresist-coated semiconductor wafer. A known projection printer apparatus is described in U.S. Pat. No. 3,819,265, issued to M. Feldman and M. C. King on June 25, 1974 and assigned to the assignee hereof. In such a known apparatus, the mask and the photoresist-coated semiconductor wafer are mounted on a common movable translation table. A small portion of the mask is imaged on the wafer by a high resolution optical system. The latter typically consists of an even number of imaging lenses, a field lens, and an odd number of mirrors in order to achieve proper image orientation and compensate for the effects of image inversion. Although this known scanning projection apparatus is acceptable for certain applications, it requires a large number of lenses and mirrors resulting in a relatively complex and expensive system. Furthermore, the spacing between corresponding points on the mask and wafer is such that scanning tolerances are small, thus requiring an expensive scan table.

A simple and economical one-to-one imaging optical system is described in an article by J. Dyson entitled "Unit Magnification Optical System without Seidel Aberrations" published in *Journal of the Optical Society of America*, Volume 49, No. 7, July 1959, pages 713–716. This known Dyson system consists of two components, namely, a concave spherical mirror of radius R, and a thick plano-convex lens of radius r, index n and thickness equal to r. The centers of curvature of both spherical surfaces are substantially coincident, and r is chosen so that parallel rays incident on the plano surface are focused on the mirror surface, i.e., $$1/(R-r) = (n-1)(1/-r) \qquad (1)$$

or $$r/R = (n-1)/n \qquad (2)$$

In this known system, object and image surfaces lie on or close to the plane face of the lens. Furthermore, object and image are of opposite directions rendering such a system inapplicable by itself to scanning photolithographic projection printers.

A modified Dyson optical system is described in a paper by C. G. Wynne entitled "A Unit-Power Telescope for Projection Copying" in a book entitled *Optical Instruments and Techniques*, pages 429–434, edited by J. H. Dickson and published by Oriel Press, Ltd., England, 1970. This known optical arrangement utilizes a beam splitter to separate the object and image planes of Dyson. The foregoing is achieved by forming a beam-splitting cube from a section of the plano-convex lens of the system resulting in an image plane at 90° from the object plane. A similar optical printing system is described in U.S. Pat. No. 2,231,378, issued on Feb. 11, 1941 to H. Becker et al. These two known printing systems require complex, heavy and bulky optics. Moreover, the known systems cannot be used in a compact "in-line" scanning projection printer, i.e., in a printing system wherein object and image have the same direction and are located in parallel planes substantially in alignment on top of each other.

In U.S. Pat. No. 3,054,326, issued Sept. 18, 1962 to H. Giesecke, a projecting device for photolithography is described comprising a roof prism, a mirror and an objective positioned therebetween. In this known projecting device, the roof prism is mounted within a cardanic suspension such that it is possible to modify the thickness of the image lines by tumbling the roof prism. Although in such a known device the object and image planes are parallel, the overall construction and accuracy of the device are such that it is inapplicable and ineffective for highly accurate semiconductor scanning projection printers. Furthermore, the objective located between the prism and the mirror comprises a plurality of symmetrically arranged lenses, the latter adding complexity and cost to the overall device.

BRIEF DESCRIPTION OF THE INVENTION

The foregoing problems are solved in accordance with an illustrative embodiment of the present invention wherein a compact image projection apparatus comprises a beam-splitting arrangement having a first and a second face for receiving incoming object radiations and projecting outgoing image radiations, respectively; and an optical arrangement coupled to said beam-splitting arrangement and comprising a plano-convex lens and a concave spherical mirror having substantially coincident centers of curvature. In accordance with the present invention, the first and second faces of the beam-splitting arrangement are parallel and proximate to an object plane and an image plane, respectively. The object and image planes, in accordance with the invention, are parallel. The beam-splitting and optical arrangements are positioned between the parallel planes such that a projected image on the image plane is of the same orientation as an object in the object plane.

In one illustrative embodiment of the invention, the beam-splitting arrangement comprises a roof prism and a right-angle prism cemented together and defining at their interface a beam splitter. A quarter wave plate may be inserted between the right-angle prism and the plano-convex lens. In such case, the interface beam splitter is a polarizing-type beam splitter.

One advantage of the present invention is to achieve a compact and economical image projection apparatus.

Another advantage of the present invention is to realize a compact image projection apparatus particularly suitable for scanning projection printers.

A further advantage of the present invention is to increase the scanning tolerances of scanning projection printers.

A still further advantage of the present invention is to achieve a compact "in-line" scanning projection printer with significant cost advantages.

These and other objects and advantages of the present invention will appear more fully upon consideration of the various illustrative embodiments now to be described in detail in connection with the accompanying drawings.

DETAILED DESCRIPTION

Figure 1:
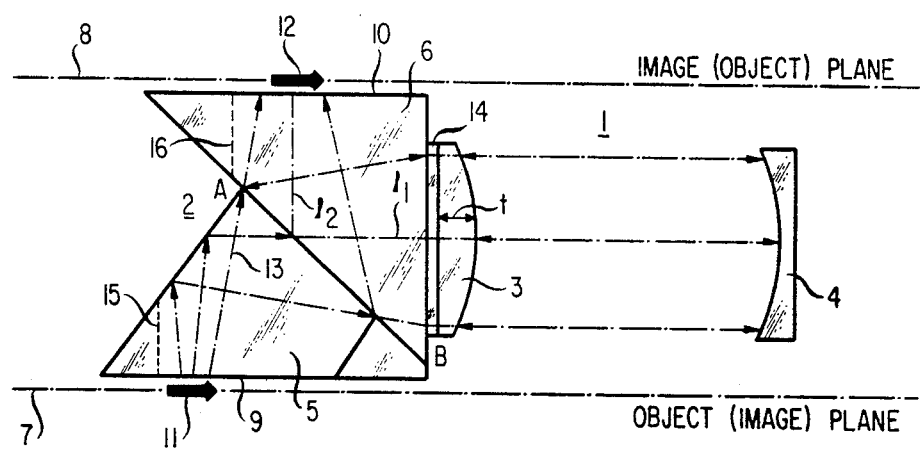
FIG. 1 shows an illustrative embodiment of a projection apparatus according to the present invention.

Referring now to a specific illustrative embodiment of the invention, as shown in FIG. 1, an image projection apparatus comprises an optical arrangement 1 and a beam-splitting arrangement 2 coupled to the optical arrangement 1. The optical arrangement 1 comprises a plano-convex lens 3 of radius r and index n, and a concave spherical mirror 4 of radius R. The centers of curvature of both spherical surfaces are substantially coincident. The beam-splitting arrangement 2, which is coupled to the optical arrangement 1, comprises a roof-type prism 5 and a right-angle prism 6 cemented together along one of each of their faces to define a beam-splitter interface AB. Prisms 5 and 6 are dimensioned such that:

$$l + t = r \qquad (3)$$

wherein $l$ is the geometric ray path length in prisms 5 or 6 (e.g., $l_1 + l_2$ in FIG. 1), and t is the thickness of the plano-convex lens 3. Beam-splitter interface AB is formed, for example, by depositing dielectric film on the adjacent faces of prisms 5 and 6. However, other well-known methods for achieving such a beam splitter may be applied without departing from the spirit and scope of the present invention. The first and second prisms 5 and 6 are positioned to define a pair of substantially parallel planes 7 and 8, respectively proximate to faces 9 and 10 of prisms 5 and 6.

In order to adapt the known Dyson-type optical system to a scanning projection printer (SPP), image and object planes must be parallel, and object and image must have the same orientation. The parallelism of object and image plane is realized by means of beam-splitting arrangement 2. In FIG. 1, plane 7 may correspond to the object or mask plane while plane 8 corresponds to the image or wafer plane, or vice versa. In accordance with the present invention, in order to achieve proper image orientation, reflecting prism 5 is a roof or Amici type prism. An object such as 11 positioned at the object plane 7 and illuminated by a polarized light source (not shown) is projected onto image plane 8 and appears on such a plane as image 12. The incoming object radiations 13 are first reflected by roof prism 5 and directed through the beam-splitter interface AB to lens 3 and mirror 4. The rays from mirror 4, after reflection at the interface AB, are directed through face 10 of prism 6 to form the image 12 on image plane 8.

A quarter wavelength plate 14, preferably made of mica, may be cemented between the lens 3 and the right-angle prism 6. In such an illustrative embodiment of the invention, interface AB is a standard polarizing-type beam splitter, which in combination with quarter wave plate 14 directs most of the light from the object plane to the image plane. The quarter wave plate 14 converts incident linearly polarized light into circularly polarized light. After reflection by the mirror 4, the light is further retarded through the quarter wave plate 14 and is converted into linearly polarized light oriented at 90 degrees from the original beam. Therefore, the incoming light rays 13 after reflection by mirror 4 are reflected at the AB interface and directed to the image plane 8.

If the illustrative embodiment is used in a photolithographic projection printer, the object and image planes 7 and 8 would correspond, respectively, to the mask and semiconductor wafer planes.

Figure 2:
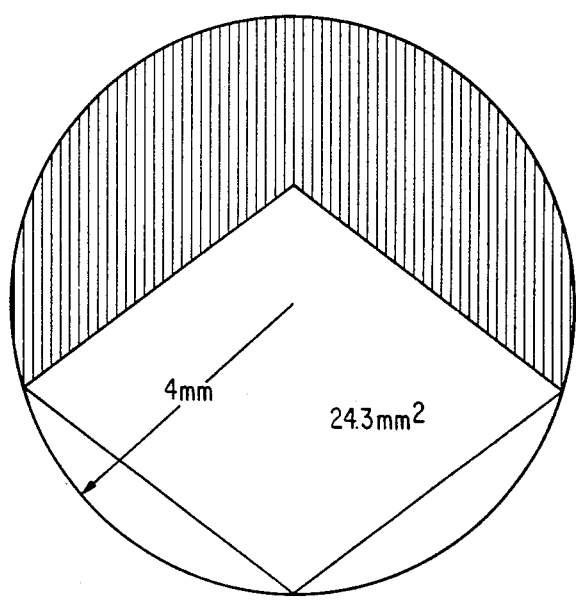
FIG. 2 illustrates the field configuration of the embodiment of FIG. 1.

In FIG. 2, an accurate scaled-up drawing of the field configuration obtained by ray tracing and geometric projection is shown. The diamond-shaped area represents the maximum portion of the object or mask that is exposed during an SPP scanning cycle. The shaded area represents the obstructed field of the projection apparatus. The plano-convex lens 3 and prisms 5 and 6, may have an index n at 0.0405 microns of 1.7576. By fixing, for example, the mirror radius R at 100 mm and the object and image air spaces at 0.2 mm (i.e., the distance between object 11 and face 9 or image 12 and face 10), the compact image projection apparatus according to the present invention has better than one quarter wave correction at f/2 over the wavelength interval 0.4–0.6 micron and has unity magnification within $\pm 1 \times 10^{-5}$. As shown in FIG. 2, over a 4 mm radius field, the diamond-shaped area required for uniform exposure of a wafer during a scanning cycle in a scanning projection printer (SPP) has an area of 24.3 mm². From the path taken by marginal rays through the apparatus, it is possible to grind away portions of prisms 5 and 6 along lines 15 and 16, for example, thereby providing additional clearance for mask and wafer fixtures. In the illustrative embodiment of FIG. 1, the distance between object or mask plane 7 and image or wafer plane 8 is of the order of 3 to 5 cm. Thus, since the spacing between corresponding points on mask and wafer is reduced, scanning tolerances in a SPP are relaxed, resulting in a more economical scan table.

It is to be understood that the embodiment described herein is merely illustrative of the apparatus according to the present invention. Various modifications may be made thereto by persons skilled in the art without departing from the spirit and scope of the invention.

What is claimed is:

1. A compact image projection apparatus comprising:
   a first surface defining an object plane;
   a second surface parallel to said first surface and defining an image plane;
   optical means positioned between said parallel surfaces comprising a plano-convex lens and a concave spherical mirror having substantially coincident centers of curvature; and
   a beam-splitting arrangement optically coupled to said means and positioned between said parallel surfaces for receiving incoming object radiations from said object plane and projecting outgoing image radiations onto said image plane to form a projected image that is of the same orientation as the object.

2. A compact image projection apparatus according to claim 1, wherein the beam-splitting arrangement comprises a roof prism and a right-angle prism cemented together and defining at their interface a beam splitter.

3. A compact image projection apparatus according to claim 2, wherein said right-angle prism has one surface parallel to said planes, another surface perpendicular to said planes and cemented to said plano-convex lens, and a third surface cemented to said roof prism thereby forming said beam splitter.

4. A compact image projection apparatus according to claim 3, wherein said roof prism has one surface parallel to said planes, and a second surface cemented to the third surface of said right-angle prism.

5. A compact image projection apparatus according to claim 4, wherein a quarter wave plate is cemented between the second face of the right-angle prism and the plano-convex lens, and wherein said beam splitter is a polarizing-type beam splitter.

6. A photolithographic projection printing process for fabricating electronic devices comprising the steps of:

positioning a mask in a first plane defining an object plane;

mounting a semiconductor wafer in a second plane parallel to said first plane;

directing incoming radiations through said mask into a beam splitting arrangement positioned between said first and said second parallel planes;

focusing the radiations out of said beam splitting arrangement through a plano-convex lens onto a concave spherical mirror surface;

directing the mirror-reflected radiations through said plano-convex lens into said beam splitting arrangement; and projecting outgoing image radiations out of said beam splitting arrangement onto said second plane to form a projected image that is of the same orientation as the object.

7. A photolithographic projection printing process for fabricating electronic devices comprising the steps of:

positioning a mask in a first plane defining an object plane;

mounting a semiconductor wafer in a second plane parallel to said first plane;

directing incoming radiations through said mask into a first one of first and second prisms positioned between said first and second parallel planes, said prisms having respective contacting faces that constitute a beam-splitting interface;

reflecting said incoming radiations in said first prism;

focusing said prism-reflected radiations via said beam-splitting interface through a plano-convex lens onto a concave spherical mirror surface;

directing the mirror-reflected radiations through said plano-convex lens and via said beam-splitting interface through said second prism; and projecting outgoing image radiations out of said second prism onto said second plane to form a projected image that is of the same orientation as the object.

* * * * *